(12) United States Patent
AuBuchon et al.

(10) Patent No.: US 11,923,233 B2
(45) Date of Patent: Mar. 5, 2024

(54) DUAL-FUNCTION WAFER BACKSIDE PRESSURE CONTROL AND EDGE PURGE

(71) Applicant: Applied Materials, Inc., Santa Clara, CA (US)

(72) Inventors: Joseph AuBuchon, San Jose, CA (US); Tejas Ulavi, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 896 days.

(21) Appl. No.: 16/910,540

(22) Filed: Jun. 24, 2020

(65) Prior Publication Data

US 2020/0411359 A1 Dec. 31, 2020

Related U.S. Application Data

(60) Provisional application No. 62/866,591, filed on Jun. 25, 2019.

(51) Int. Cl.
| | |
|---|---|
| H01L 21/687 | (2006.01) |
| C23C 16/455 | (2006.01) |
| C23C 16/458 | (2006.01) |
| C23C 16/46 | (2006.01) |
| C23C 16/52 | (2006.01) |

(Continued)

(52) U.S. Cl.
CPC .. H01L 21/68792 (2013.01); C23C 16/45544 (2013.01); C23C 16/4586 (2013.01); C23C 16/466 (2013.01); C23C 16/52 (2013.01); H01L 21/67017 (2013.01); H01L 21/67126 (2013.01);
(Continued)

(58) Field of Classification Search
CPC ......... H01L 21/67126; H01L 21/68792; H01L 21/67017; H01L 21/6833; H01L 21/68785; H01L 21/68735; H01L 21/67109; H01L 21/6831; C23C 16/4586; C23C 16/466; C23C 16/46; C23C 16/52; C23C 16/45544
See application file for complete search history.

(56) References Cited

U.S. PATENT DOCUMENTS 5,804,507 A * 9/1998 Perlov ..................... B24B 37/04
438/692
6,189,482 B1 * 2/2001 Zhao ..................... H01J 37/3244
118/724

(Continued)

FOREIGN PATENT DOCUMENTS

| JP | 2018041776 A | 3/2018 |
| WO | 2016109008 A1 | 7/2016 |

OTHER PUBLICATIONS

PCT International Search Report and Written Opinion in PCT/US2020/039309 dated Oct. 6, 2020, 13 pages.

*Primary Examiner* — Savitri Mulpuri
(74) *Attorney, Agent, or Firm* — Servilla Whitney LLC (57) ABSTRACT

Apparatus and methods for providing backside pressure control and edge purge gas to a substrate in a processing chamber. A seal band within a pocket of a substrate support defines an inner pocket region and an outer pocket region. The seal band has a pressure dependent controlled leakage rate so that a backside gas flow to the inner pocket region can diffuse through the seal band to the outer pocket region to create an edge purge while providing backside pressure to the substrate. Processing chambers, methods of processing a substrate and non-transitory computer-readable medium containing instructions to process a substrate are also disclosed.

16 Claims, 5 Drawing Sheets

(51) Int. Cl.
*H01L 21/67* (2006.01)
*H01L 21/683* (2006.01)

(52) U.S. Cl.
CPC .... *H01L 21/6833* (2013.01); *H01L 21/68735* (2013.01)

(56) References Cited

U.S. PATENT DOCUMENTS

| | | |
|---|---|---|
| 7,672,110 B2 | 3/2010 | Sun et al. |
| 2008/0236479 A1 | 10/2008 | Kiku et al. |
| 2018/0286642 A1* | 10/2018 | Matyushkin .......... C23C 16/466 |
| 2019/0272982 A1* | 9/2019 | Hawrylchak ....... H01J 37/3244 |

\* cited by examiner

DUAL-FUNCTION WAFER BACKSIDE PRESSURE CONTROL AND EDGE PURGE

CROSS-REFERENCE TO RELATED APPLICATIONS

This application claims priority to U.S. Provisional Application No. 62/866,591, filed Jun. 25, 2019, the entire disclosure of which is hereby incorporated by reference herein.

TECHNICAL FIELD

Embodiments of the disclosure are directed to substrate support components. In particular, embodiments of the disclosure are directed to integrated backside pressure control and edge purge components.

BACKGROUND

In a semiconductor wafer processing chamber, such as an atomic layer deposition (ALD) chamber, backside pressure control and wafer edge purging are useful features. The primary functions of these features are to provide backside pressure control to improve temperature uniformity of the wafer and edge purging to prevent deposition on the backside and curbed edge of the wafer.

Conventional backside pressure control is accomplished with a seal band on the pedestal surface near the wafer edge. The gas flow path goes through the pedestal to a pocket behind the wafer and into the seal band. Pressure control is done with a component that controls flow rate, measures pressure, and has a flow path to a pump that bypasses the chamber.

Conventional edge purge can be accomplished by a couple different techniques. Gas can be delivered through a line in the pedestal and distributed to the edges underside of the wafer edge through either a recursive channel, a plenum near the circumference of the pedestal, or a combination of both. This technique requires an edge ring design that goes around the wafer to direct the flow of gas. The edge ring can be integrated into the pedestal or a separate component. The edge purge techniques are limited in effectiveness based on how well the flow can be distributed around the edge of the wafer.

For both backside pressure control and edge purging, any features put into a pedestal will impact other design components and goals. For example, putting a gas distribution channel in a pedestal will have a negative impact on the temperature uniformity that can be achieved with that pedestal due to required design compromises. Therefore, there is a need in the art for improved apparatus for backside pressure control and edge purging.

SUMMARY

One or more embodiments of the disclosure are directed to substrate support pedestals comprising a support body, with a pocket and a seal band. The support body has a top surface and a bottom surface defining a thickness. The pocket is formed in the top surface of the support body. The pocket has a bottom surface, a depth and an outer peripheral edge. The seal band conforms to a shape of the pocket and is spaced a distance from the outer peripheral edge of the pocket to form an inner pocket region and an outer pocket region. The seal band has a top surface an inner face and an outer face defining a width. The seal band has one or more property providing controlled leakage of gases from the inner pocket region through the width of the seal band to the outer pocket region.

Additional embodiments of the disclosure are directed to processing methods comprising: providing a flow of gas to an inner pocket region of a substrate support pedestal; providing a flow of toward a substrate supported on the seal band; and controlling the flow of gas to the inner pocket region to maintain a uniform flow of gas from the inner pocket region through the seal band to the outer pocket region.

Further embodiments of the disclosure are directed to non-transitory computer readable medium including instructions, that, when executed by a controller of a processing chamber, cause the processing chamber to perform operations of: flowing a backside gas to an inner pocket region of a substrate support pedestal, the inner pocket region bounded by a seal band having a pressure differential controlled leakage rate; flowing a process gas to a reaction space in the processing chamber; determining a pressure differential between the inner pocket region and an outer pocket region at an outside of the seal band, the outer pocket region having a pressure substantially equal to about pressure in the reaction space; and controlling the flow of backside gas to the inner pocket region to maintain a uniform flow of gas from the inner pocket region through the seal band to the outer pocket region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Embodiments of the disclosure are directed to apparatus and methods for integrating backside pressure control and edge purge in a process chamber. In some embodiments, backside pressure control is achieved by creating a controlled leak through the seal band so that the backside pressure control gas will also function as the edge purge gas.

Some embodiments of the disclosure advantageously provide apparatus and methods to create or improve a uniform controlled leak around the seal band so that the resulting edge purge gas flow uniformity is improved. With a more uniform edge purge gas, the flow rate of the edge purge gas in some embodiments is reduced. Some embodiments advantageously provide a lower impact to the gas flows above the wafer (with less uniform distribution, higher flow is needed to insure that the low flow sides of the wafer are protected).

Some embodiments advantageously eliminate the need for a recursive gas distribution lines or plenums in the pedestal as the edge gas flow comes from the pocket of backside gas below the wafer. One or more embodiments of the disclosure advantageously provide the ability to focus pedestal designs on other things, like thermal uniformity instead of needing to make design compromises for backside gas and edge flows. Some embodiments of the disclosure advantageously use a single gas delivery path, which reduces cost and gas panel space over an approach that needs two gas delivery paths.

Figure 1:
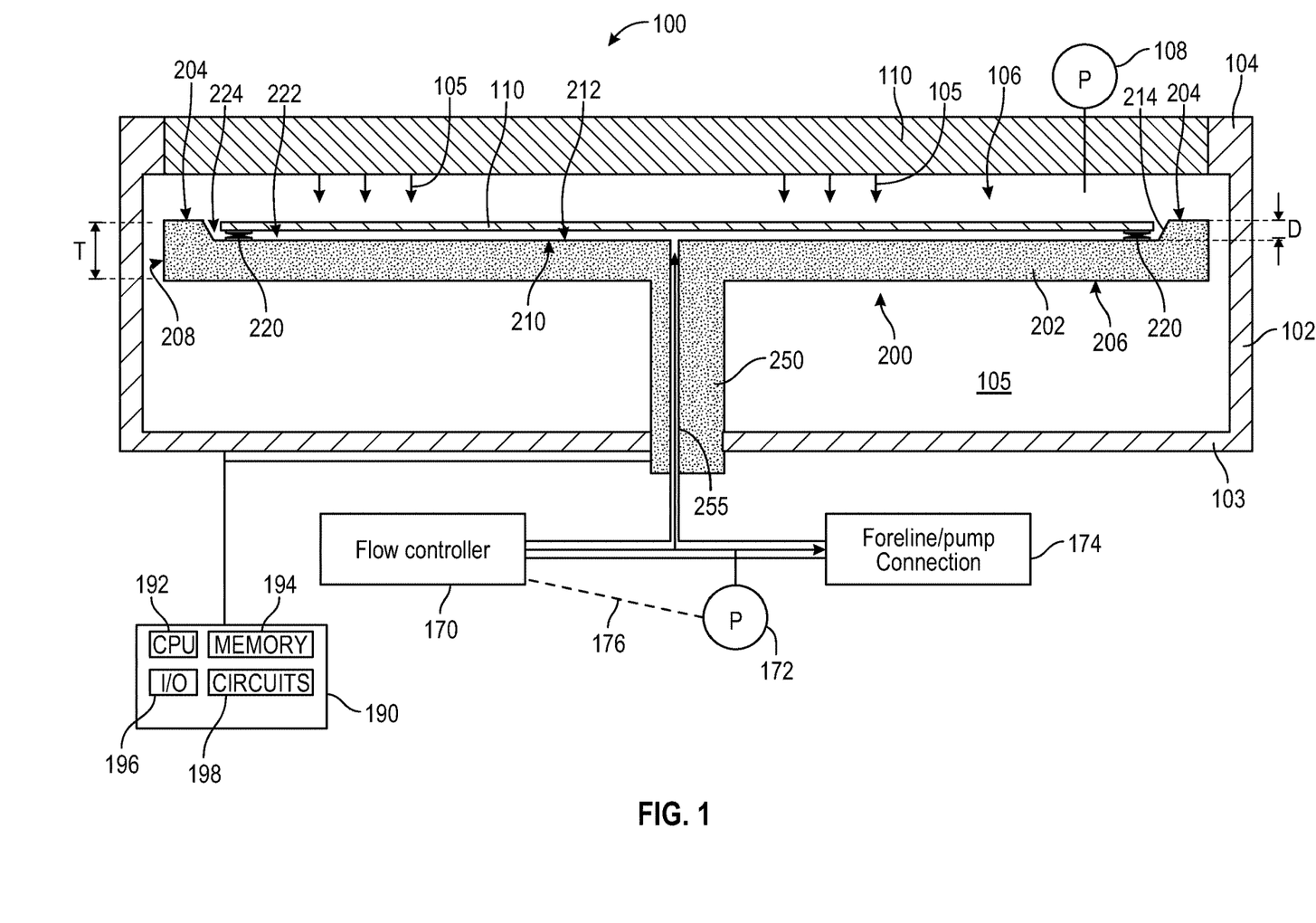
FIG. 1 shows a cross-sectional schematic view of a processing chamber in accordance with one or more embodiment of the disclosure.

Referring to FIG. 1, one or more embodiments of the disclosure are directed to substrate support pedestals 200 and processing chambers 100 comprising the substrate support pedestals 200. The processing chamber 100 illustrated in FIG. 1 comprises a chamber wall 102, bottom 103 and top 104 enclosing an interior volume 105. A gas distribution assembly 110 is within the processing chamber 100 to provide a flow of gas 112 into the interior volume 105.

In the illustrated embodiment, the gas distribution assembly 110 is part of the chamber top 104. However, the skilled artisan will recognize that the gas distribution assembly 110 can be separate from the chamber top 104 or located in a different portion of the interior volume 105 of the processing chamber 100. For example, in some embodiments, the gas distribution assembly provides a flow of gas from a sidewall 102 of the chamber 100 at an oblique angle relative to the top surface of the substrate support.

FIGS. 1 through 5 illustrate a substrate support pedestal 200 according to various embodiments of the disclosure. The substrate support pedestal 200 includes a support body 202 for supporting a wafer or substrate during processing. The support body 202 has a top surface 204 and bottom surface 206 that defines a thickness T of the support body 202. The support body 202 has an outer edge 208 which defines a general shape of the support body 202. In some embodiments, the support body 202 is a generally cylindrical component having a circular outer edge 208 and thickness T.

A pocket 210 is formed in the top surface 204 of the support body 202. The pocket 210 has a bottom surface 212, a depth D and an outer peripheral edge 214. The pocket 210 can have any suitable shape and size depending on, for example, the substrates being processed. The embodiments illustrated in the Figures show substrate support pedestals 200 for use with round substrates. However, the skilled artisan will recognize that the disclosure is not limited to round substrates and round support bodies 202 and that any suitable shape substrate and support body can be used.

Figure 4:
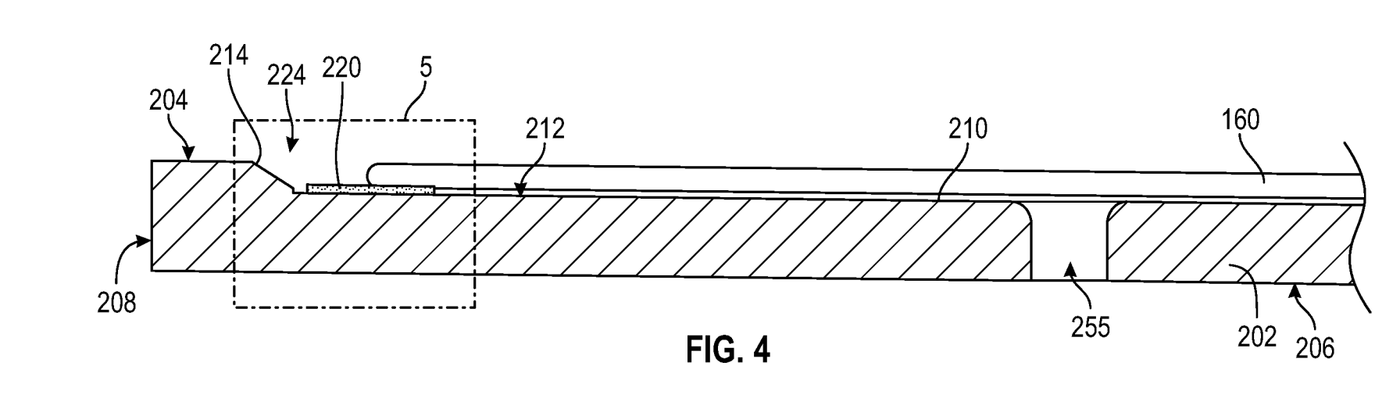
FIG. 4 shows a partial cross-sectional schematic view of a substrate support pedestal according to one or more embodiment of the disclosure.
Figure 5:
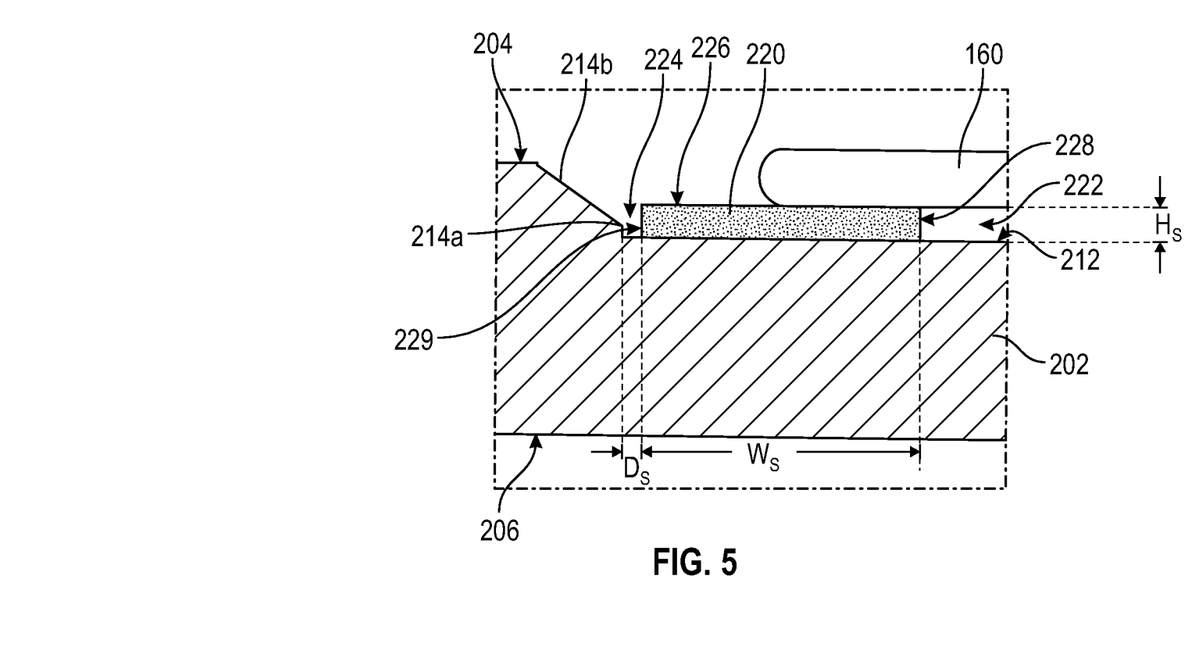
FIG. 5 shows an expanded view of region 5 of FIG. 4.

The substrate support pedestal 200 includes a seal band 220 that conforms to the shape of the pocket 210. The seal band 220 is spaced a distance $D_S$ from the outer peripheral edge 214 to separate the pocket 210 into an inner pocket region 222 and an outer pocket region 224. The outer peripheral edge 214 shown in FIG. 1 slopes upward from the bottom surface 212 of the pocket 210 to the top surface 204 of the support body 202. In some embodiments, as shown in FIGS. 4 and 5, the outer peripheral edge 214 has an inner wall portion 214a and an outer wall portion 214b. The distance $D_S$ is defined as the distance between seal band 220 and the innermost portion of the wall portion, in FIG. 5, inner wall portion 214a.

The distance from the outer peripheral edge 214 of the pocket 210 to the outer face 229 of the seal band 220 can be any suitable distance. In some embodiments, the outer face 229 of the seal band 220 is the outer peripheral edge 214 of the pocket 210. In some embodiments, the outer face 229 of the seal band 220 is spaced from the outer peripheral edge 214 of the pocket 210 by in the range of about 0.25 mm to about 10 mm, or in the range of about 0.5 mm to about 6 mm, or in the range of about 0.75 mm to about 4 mm, or in the range of about 1 mm to about 2 mm. In some embodiments, the seal band 220 has an inner diameter in the range of 292 mm to 297 mm.

The seal band 220 has a top surface 226, an inner face 228 and an outer face 229. The width $W_S$ of the seal band 220 is defined as the distance between the inner face 228 and the outer face 229, as shown in FIG. 5. The width $W_S$ of the seal band 220 can be any suitable width. In some embodiments, the width $W_S$ of the seal band 220 is in the range of about 0.5 mm to about 25 mm, or in the range of about 1 mm to about 20 mm, or in the range of about 2 mm to about 15 mm, or in the range of about 3 mm to about 10 mm.

The height $H_S$ of the seal band 220 is defined as the distance from the bottom surface 212 of the pocket 210 to the top surface 226 of the seal band 220, as shown in FIG. 5. The height $H_S$ of the seal band 220 can be any suitable size. In some embodiments, the height $H_S$ of the seal band 220 is in the range of about 10 μm to 100 μm, or in the range of about 15 μm to about 60 μm, or in the range of about 0.2 mm to about 20 mm, or in the range of about 0.5 mm to about 15 mm, or in the range of about 0.75 mm to about 10 mm, or in the range of about 1 mm to about 5 mm. In some embodiments, the seal band 220 has a height $H_S$ sufficient so that a wafer 160 supported on the top surface 226 of the seal band 220 is substantially coplanar with the top surface 204 of the support body 202. As used in this manner, the term "substantially coplanar" means that the major plane formed by the substrate 160 is within ±0.5 mm of the major plane of the top surface 204 of the support body 202.

Figure 6:
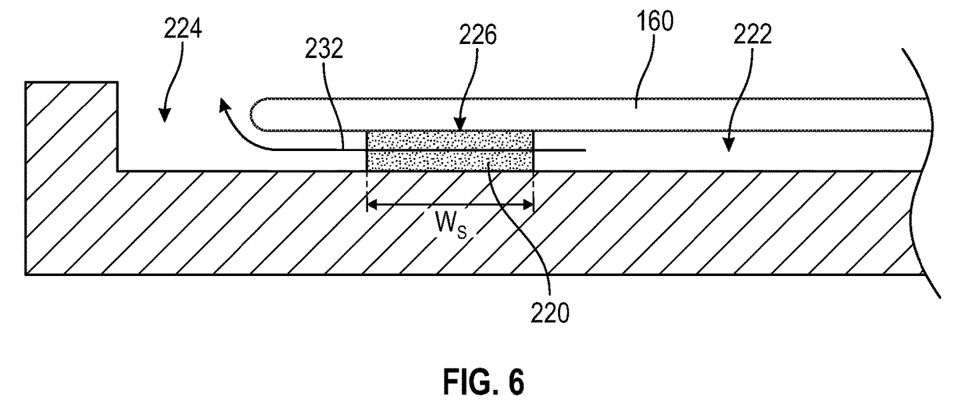
FIG. 6 shows a partial cross-sectional schematic view of a substrate support pedestal according to one or more embodiment of the disclosure.

The seal band 220 has one or more properties that provide a controlled leakage of gases through the seal band 220 so that a gas 232 can diffuse through the seal band 220 form the inner pocket region 222 to the outer pocket region 224, as illustrated in FIG. 6. The gas 232 diffusing through the seal band 220 helps prevent deposition on the backside of the substrate 160. As used in this manner, the term "controlled leakage" means that the rate of gas 232 diffusion through the seal band 220 is known.

The properties of the seal band 220 that affect the diffusion rate through the seal band 220 include parameters such as, but not limited to, the material of the seal band 220, the width WS of the seal band 220, the height HS of the seal band 220, the pressure in the inner pocket region 222, and the pressure in the outer pocket region 224 (which is the same as the pressure in the interior volume of the process chamber or the reaction space above the substrate).

In some embodiments, the controlled leakage rate is referred to as a pressure-dependent or pressure-differential controlled leakage rate. The greater the pressure differential between the inner pocket region 222 and the outer pocket region 224 will result in a higher pressure-differential controlled leakage rate because the pressure-differential between the inner pocket region 222 and the outer pocket region 224 affects the diffusion rate.

In the embodiment illustrated in FIG. 6, the substrate 160 covers the top surface 226 of the seal band 220 so that the gas 232 diffuses through the width $W_S$ of the seal band 220 from the inner face 228 to the outer face 229. In the embodiment illustrated in FIGS. 4 and 5, the substrate 160 covers a portion of the top surface 226 of the seal band 220 so that a gas diffusing through the seal band 220 starts at the inner face 228 of the seal band 220 and can exit the top surface 226 of the seal band 220 without going through the entire width $W_S$ of the seal band 220.

Figure 7A:
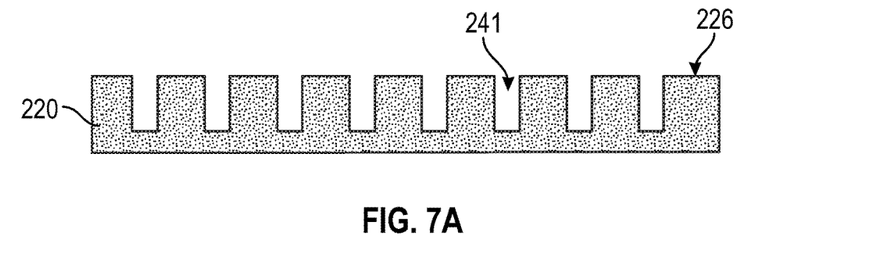
FIGS. 7A through 7E show partial cross-sectional schematic view or seal bands according to one or more embodiment of the disclosure.
Figure 7B:
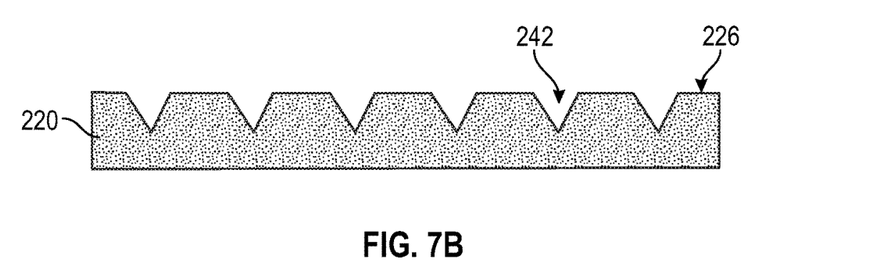
Figure 7C:
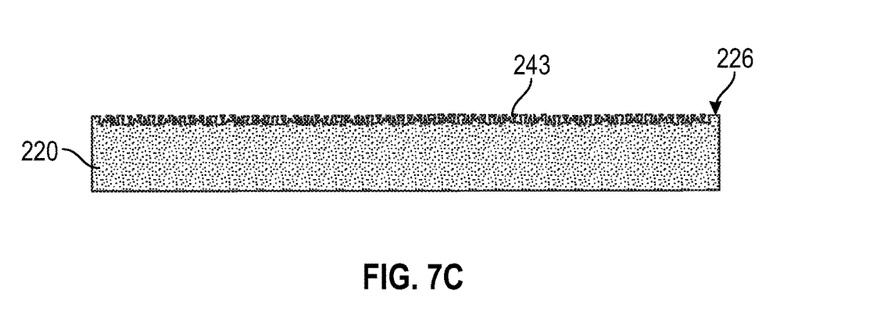
Figure 7D:
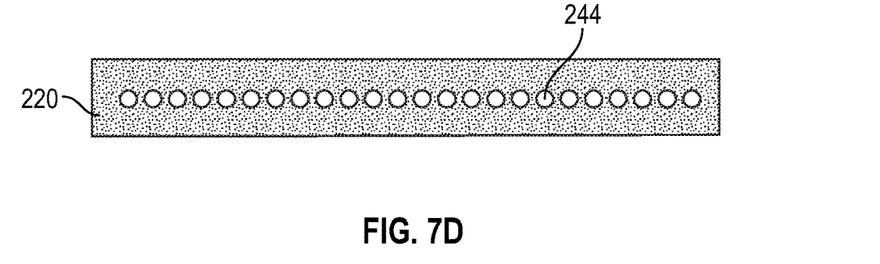
Figure 7E:
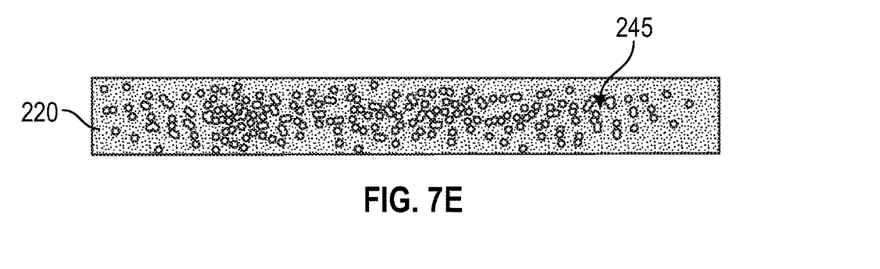

In some embodiments, the property of the seal band 220 that provides the controlled leakage of gases is the material shape and or composition of the seal band 220. Referring to FIGS. 7A through 7E illustrate various embodiments of the seal band 220. In FIG. 7A the seal band 220 has a plurality of cut outs 241 in the top surface 226. FIG. 7B shows a plurality of cut outs 242 with a different shape than the cut outs 241 of FIG. 7A. The area or volume of the cut outs 241, 242 can be changed to change the controlled leakage rate through the seal band 220. In some embodiments, as shown in FIG. 7C, the seal band 220 has a roughened surface 243. The surface roughness can be modified to change the diffusion rate through the seal band. In FIG. 7D, a plurality of channels 244 extend through the body of the seal band 220. The area, volume, etc., of the channels 244 can be changed to affect the diffusion rate. In FIG. 7E, the seal band 220 comprises a porous material 245. The porosity of the seal band 220 can be changed to affect the diffusion rate.

Figure 2:
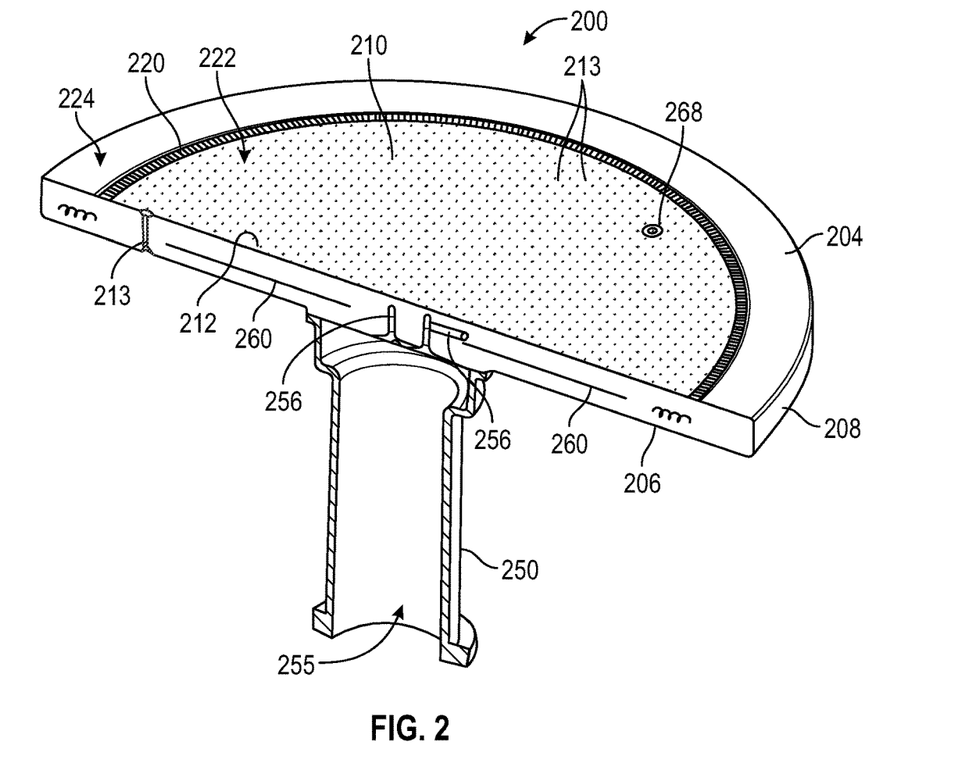
FIG. 2 shows cross-sectional orthoscopic view of a substrate support pedestal according to one or more embodiment of the disclosure.

As shown in FIGS. 1 and 2, the substrate support pedestal 200 of some embodiments includes a pedestal shaft 250. The pedestal shaft 250 extends from the bottom surface 206 of the body 202. In some embodiments, the pedestal shaft 250 is integrally formed with the support body 202 (as shown in FIG. 1). In some embodiments, the pedestal shaft 250 is a separate component from the support body 202 (as shown in FIG. 2).

The pedestal shaft 250 of some embodiments comprises a gas line 255 that extends through the pedestal shaft 250 to an opening 213 in the bottom surface 212 of the pocket 210. The support body 202 of some embodiments includes a channel 256 forming fluid communication between the gas line 255 and the openings 213. The embodiment illustrated in FIG. 2 has a pedestal shaft 250 with a gas line 255 extending through the pedestal shaft to openings 213 in the bottom surface 212 of the inner pocket region 222 of the pocket 210 through channels 256.

Referring to FIG. 2, is some embodiments, the support body 202 is an electrostatic chuck. As will be understood by the skilled artisan, an electrostatic chuck includes one or more electrode 260 which can be polarized to chuck a substrate to the support body 202. In some embodiments, the support body 202 includes one or more thermal element 265 within the thickness of the support body 202. The thermal elements 265 are connected to a power source (not shown) which can cause a change in the temperature of the support body 202. In some embodiments, the thermal elements 265 are heating coils. In some embodiments, the thermal elements 265 are cooling elements. In some embodiments, the thermal elements 265 comprise heating coils and cooling elements to control the temperature of the substrate.

Figure 3:
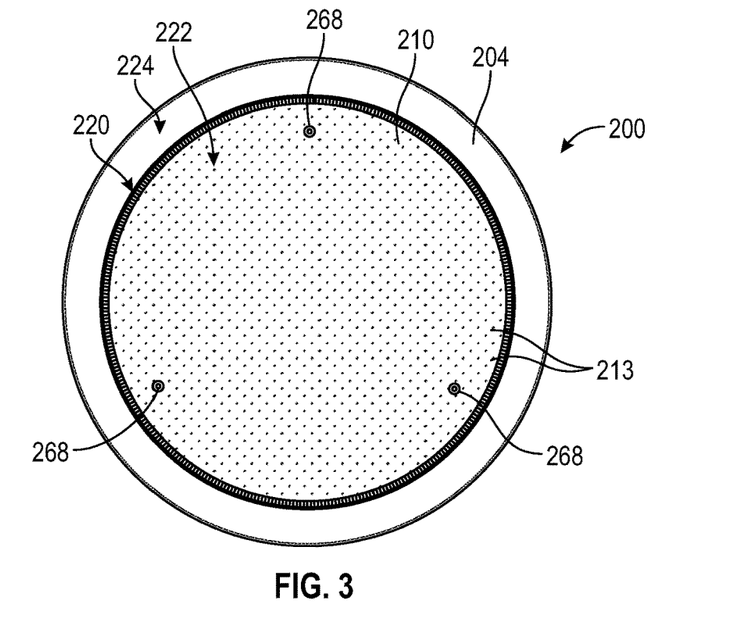
FIG. 3 shows a top view of a substrate support pedestal according to one or more embodiment of the disclosure.

In the embodiment illustrated in FIGS. 2 and 3, the support body 202 includes a plurality of lift pin openings 268. As will be understood by the skilled artisan, left pins (not shown) can pass through the openings 268 to elevate or lower a substrate into the pocket 210 onto the seal band 220. The openings 268 can be larger than the lift pins to allow translational correction of the wafer placement to center the substrate in the pocket.

Referring back to FIG. 1, some embodiments include one or more of a flow controller 170, pressure gauge 172, pump 174 or feedback circuit 176 connected to the gas line 255. The skilled artisan will be familiar with flow controllers, pressure gauges, pumps and feedback circuits for use with processing chambers. In some embodiments, the flow controller 170, pressure gauge 172, pump 174 and feedback circuit 176 are used to control a flow of backside gas through the gas line 255 into the inner pocket region 222 of the pocket 210.

In the embodiment illustrated in FIG. 1, the flow controller 170 is upstream of and in fluid communication with the gas line 255. The pressure gauge 172 is downstream of and in fluid communication with the gas line 255 and the pump 174 is downstream of the pressure gauge 172 and in fluid communication with the gas line 255. The combination of the flow controller 170, pressure gauge 172 and pump 174 can be used to control the backside gas pressure provided to the inner pocket region 222. In some embodiments, the feedback circuit 176 is configured to measure pressure in the gas line 255 and adjusts the flow controller 172 to maintain a uniform pressure within the gas line 255.

In some embodiments, the substrate support pedestal 200 or processing chamber 100, or both, is connected to a controller 190. The controller 190 can be configured to control and/or receive information from one or more of the flow controller 170, pressure gauge 172, pump 174 or feedback circuit 176. In some embodiments, the feedback circuit 176 is a part of the controller 190.

In the processing chamber 100 of FIG. 1, the substrate support pedestal 200 within the interior volume 105 of the processing chamber 100 defines a reaction space 106 adjacent the top surface 204 of the support body 202. The gas distribution assembly 110 directs a flow 105 of gas toward the top surface 204 of the support body 202 and substrate 160. A reaction space pressure gauge 108 is configured to measure the pressure within the reaction space 106.

Some embodiments of the processing chamber 100 include at least one controller 190 coupled to one or more of the processing chamber 100, pedestal 200, flow controller 170, pressure gauge 172, pump 174, feedback circuit 176, reaction space pressure gauge 108 or gas distribution assembly 110. In some embodiments, there are more than one controller 190 connected to the individual components and a primary control processor is coupled to each of the separate controller or processors to control the system. The controller 190 may be one of any form of general-purpose computer processor, microcontroller, microprocessor, etc., that can be used in an industrial setting for controlling various chambers and sub-processors.

The at least one controller 190 can have a processor 192, a memory 194 coupled to the processor 192, input/output devices 196 coupled to the processor 192, and support circuits 198 to communication between the different electronic components. The memory 194 can include one or more of transitory memory (e.g., random access memory) and non-transitory memory (e.g., storage).

The memory 194, or a computer-readable medium, of the processor may be one or more of readily available memory such as random access memory (RAM), read-only memory (ROM), floppy disk, hard disk, or any other form of digital storage, local or remote. The memory 194 can retain an instruction set that is operable by the processor 192 to control parameters and components of the system. The support circuits 198 are coupled to the processor 192 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 190 has one or more configurations to execute individual processes or sub-processes to perform embodiments of the method. The controller 190 can be connected to and configured to operate intermediate components to perform the functions of the methods. For example, the controller 190 can be connected to and configured to control one or more of gas valves, actuators, motors, slit valves, vacuum control, etc.

The controller 190 or non-transitory computer readable medium of some embodiments has one or more configurations or instructions selected from: a configuration to move a substrate on a robot to the lift pins; a configuration to load and/or unload substrates from the system; a configuration to provide a flow of gas through the gas distribution assembly, a configuration to measure the reaction space pressure; a configuration to measure the pressure in the gas line; a configuration to control a flow controller to control a flow of backside gas to the gas line; a configuration to control the flow of gas to the pump from the gas line and flow controller to regulate the pressure in the gas line; a configuration to adjust the flow controller to maintain a uniform pressure within the gas line based on readings from the reaction space pressure gauge; a configuration to maintain a positive pressure in the inner pocket region relative to the reaction space; a configuration to control the electrostatic chuck and/or electrode within the support body; a configuration to control the thermal element to control the temperature of the support body.

In some embodiments, the non-transitory computer readable medium or controller includes instructions to flow a backside gas to an inner pocket region of the substrate support pedestal; a configuration to flow a process gas to the reaction space in the processing chamber; a configuration to determine a pressure differential between the inner pocket region and an outer pocket region at an outside of the seal band or the pressure of the reaction space; and/or controlling the flow of backside gas to the inner pocket region to maintain a uniform flow of gas from the inner pocket region through the seal band to the outer pocket region In some embodiments, the pressure in the inner pocket region is sufficient to allow a uniform flow of gas through the seal band to create a pressure in the outer pocket region greater than or equal to the pressure in the reaction space. Maintaining positive pressure in this manner helps prevent process gases from flowing to the back side of the wafer either outside the diameter of the seal band or through the seal band to the inner pocket region.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A substrate support pedestal comprising:
   a support body having a top surface and a bottom surface defining a thickness;
   a pocket formed in the top surface of the support body, the pocket having a bottom surface, a depth and an outer peripheral edge; and
   a seal band conforming to a shape of and spaced a distance from the outer peripheral edge of the pocket to form an inner pocket region and an outer pocket region, the seal band having a top surface an inner face and an outer face defining a width, the seal band providing controlled leakage of gases from the inner pocket region through the width of the seal band to the outer pocket region, wherein the seal band property providing controlled leakage of gases comprises one or more of cut outs in the top surface of the seal band, a roughened top surface of the seal band, channels extending through the width of the seal band or a porous material composition, wherein the seal band has a height sufficient so that a wafer supported on the top surface of the seal band is substantially coplanar with the top surface of the support body.

2. The substrate support pedestal of claim 1, wherein the seal band is spaced from the outer peripheral edge of the pocket by a distance in the range of about 1 to about 2 mm.

3. The substrate support pedestal of claim 1, wherein the seal band has a height in the range of about 15 μm to about 60 μm.

4. The substrate support pedestal of claim 1, wherein the support body is an electrostatic chuck comprising electrodes.

5. The substrate support pedestal of claim 1, wherein the support body comprises heater coils within the thickness of the support body.

6. The substrate support pedestal of claim 1, further comprising a pedestal shaft extending from the bottom surface of the support body.

7. The substrate support pedestal of claim 6, wherein the pedestal shaft comprises a gas line extending through the pedestal shaft to an opening in the bottom surface of the inner pocket region of the pocket.

8. The substrate support pedestal of claim 7, further comprising a flow controller, pressure gauge, pump and feedback circuit connected to the gas line to control a flow of gas through the gas line into the inner pocket region of the pocket.

9. The substrate support pedestals of claim 8, further comprising a controller configured to control and/or receive information from one or more of the flow controller, pressure gauge, pump or feedback circuit.

10. The substrate support of claim 9, wherein the flow controller is upstream of and in fluid communication with the gas line, the pressure gauge is downstream of and in fluid communication with the gas line and the pump is downstream of the pressure gauge and in fluid communication with the gas line, and the feedback circuit is configured to measure pressure in the gas line and adjust the flow controller to maintain a uniform pressure within the gas line.

11. A processing chamber comprising:
the substrate support pedestal of claim 10 within the processing chamber defining a reaction space adjacent the top surface of the support body;
a gas distribution assembly directing a flow of gas toward the top surface of the support body; and
a reaction space pressure gauge configured to measure pressure within the reaction space.

12. The processing chamber of claim 11, wherein the controller is configured to adjust the flow controller to maintain a uniform pressure within the gas line based on readings from the reaction space pressure gauge.

13. The processing chamber of claim 12, wherein the controller is configured to maintain a positive pressure in the inner pocket region relative to the reaction space.

14. The processing chamber of claim 13, wherein the pressure in the inner pocket region is sufficient to allow a uniform flow of gas through the seal band to create a pressure in the outer pocket region greater than or equal to pressure in the reaction space.

15. The processing chamber of claim 14, wherein the support body comprises one or more electrode to act as an electrostatic chuck and the controller is further configured to provide power to the one or more electrode to cause a substrate to be chucked to the top surface of the seal band.

16. The processing chamber of claim 15, wherein the support body comprises one or more thermal element and the controller is further configured to provide power to the one or more thermal element to control temperature of the support body.

* * * * *